United States Patent
Agarwal et al.

(10) Patent No.: US 7,551,475 B2
(45) Date of Patent: Jun. 23, 2009

(54) DATA SHIFTING THROUGH SCAN REGISTERS

(75) Inventors: Vikas Agarwal, Austin, TX (US); Sam Gat-Shang Chu, Round Rock, TX (US); Hung Qui Le, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 11/278,439

(22) Filed: Apr. 3, 2006

(65) Prior Publication Data

US 2007/0240023 A1    Oct. 11, 2007

(51) Int. Cl.
*G11C 11/00*    (2006.01)
*G11C 19/00*    (2006.01)

(52) U.S. Cl. .................. 365/154; 365/201; 714/729

(58) Field of Classification Search .................. 365/78, 365/82, 131, 189.05, 189.12, 201, 219, 221, 365/240; 711/109, 110; 377/64, 77, 78, 377/79, 80, 69; 714/726, 727, 729
See application file for complete search history.

(56) References Cited

U.S. PATENT DOCUMENTS

| | | | |
|---|---|---|---|
| 4,742,293 A * | 5/1988 | Koo et al. .................. 714/726 |
| 5,003,304 A | 3/1991 | Takinomi et al. |
| 5,504,703 A * | 4/1996 | Bansal .................. 365/156 |
| 5,640,402 A | 6/1997 | Motika et al. |
| 6,202,185 B1 | 3/2001 | Lee |
| 6,288,744 B1 | 9/2001 | Takahashi et al. |
| 6,967,639 B2 | 11/2005 | Kanzaki et al. |
| 7,328,385 B2 * | 2/2008 | Warren et al. .................. 714/726 |
| 2004/0250184 A1 * | 12/2004 | Chu et al. .................. 714/726 |
| 2006/0168393 A1 * | 7/2006 | Christensen et al. .................. 711/109 |

FOREIGN PATENT DOCUMENTS

| EP | 0351742 A2 | 1/1990 |
|---|---|---|
| JP | 11166961 A | 6/1999 |

* cited by examiner

*Primary Examiner*—J. H. Hur
*Assistant Examiner*—Douglas King
(74) *Attorney, Agent, or Firm*—Yee & Associates, P.C.; Libby Z. Handelsman

(57) ABSTRACT

A circuit permits a user to present signals to control the flow of data from a first-type cell to a second-type cell. The circuit is susceptible to loading each cell individually, as well as loading cells by means of scanning input in a series through a low order cell to a higher order cell. The circuit may be copied as a series of cells wherein a bit held in each first-type cell is copied to the next higher second-type cell.

3 Claims, 3 Drawing Sheets

DATA SHIFTING THROUGH SCAN REGISTERS

BACKGROUND OF THE INVENTION

1. Field of the Invention

The present invention relates generally to digital circuit architecture, and more specifically to a manner of flushing a stored bit to a nearby cell in a scannable register.

2. Description of the Related Art

A scan path is a technique circuit designers use to increase the controllability and observability of a logic circuit by incorporating "scan registers" into the circuit. Normally, these scan registers act like flip-flops or other latches but circuit designers can switch the scan registers into a "test" mode where the collection of scan registers becomes one long shift register. Scan registers are serial logic circuits. A serial logic circuit operates based on a timing signal or a clock signal. Conventional scan registers move data in two ways. The first way, is to move all bits stored to an adjacent cell of the scan register. The second way, is to read one or more bits out of the register, and then write one or more bits.

A clock signal is a timing signal that alternates between binary 1 and binary 0 at a frequency. The clock signal may have sharp transitions that are brief, followed by an interval of binary 1 or 0. Generally, a clock signal is periodic with small acceptable tolerances for changes in the period between transitions.

Each latch of a scan register stores a logic voltage. A logic voltage is a voltage range that is accepted to mean a binary 1 or a voltage range that is accepted to mean a binary 0. A circuit designer establishes the voltage range with reference to a ground voltage of an overall circuit. Ground voltage is a voltage that a circuit designer makes available in activated circuit boards that occurs, within some tolerances, at an equal voltage throughout the device that a ground voltage conductor reaches. Typically, accepted voltages for a binary 1 are 0.9 to 1.0 volts. Typically, accepted voltages for a binary 0 are 0.0 to 0.1 volts. The binary 1 is complementary to the binary 0. The binary 0 is complementary to the binary 1.

A bit is a logical description of a voltage that is stored at a circuit node. A latch is a circuit that maintains a voltage at a circuit node. A circuit node is a contiguous conductor that may have multiple branches. A latch may maintain a complementary voltage at a complementary circuit node.

A line or node is a contiguous conductor, and may have several branches. It is sometimes helpful to have a way to flush a bit stored on a conductor of a latch to a nearby latch. Unlike copying bits to adjacent latches in a serial scan, a flush copies a selected sub-set of bits or voltages in a subset of latches to another subset of latches. In addition, flushing from one subset to another subset is most beneficial when the flush occurs in a single clock-cycle of a circuit's operation.

A gate is a transistor having an input line, a gate signal line, and an output line, wherein the gate couples a voltage present on the input line to an output line, upon application of, for example, a 1 bit to the gate signal line. A semiconductor couples the gate input line and the gate output line, wherein the semiconductor is a component of the gate that intervenes between the input line and the output line. A binary 1 voltage applied to the gate signal line establishes a voltage in the semiconductor that permits the output line to receive the voltage of the input line. For example, a gate is a metal-oxide semiconductor field effect transistor.

An AND gate is a logic circuit that has at least two inputs each capable of receiving a bit, wherein the output of the AND gate is a binary 1 if all the received bits are also binary 1. When an AND gate receives two bits or logical voltages, the AND gate logically 'ands' the bits to form the output.

An OR gate is a logic circuit that has at least two inputs each capable of receiving a bit, wherein the output of the OR gate is a binary 1 if any of the received bits are binary 1. When an OR gate receives two bits or logical voltages, the OR gate logically 'ors' the bits to form the output.

It would be helpful to be able to flush or transfer data from first cell or entry of the scan register to an adjacent cell without removing the data from the first cell. Moreover, in a chain of such cells, it would be convenient to flush bits for every other cell.

SUMMARY OF THE INVENTION

A circuit for flushing a logic voltage is disclosed. The circuit has a first-type cell having a first-type bit storage and at least one scan input. The circuit has second-type cell having a second-type bit storage and at least one scan input coupled to the first-type cell. In addition, the circuit has a control circuit responsive to a flush input signal and a clock signal to flush a bit from the first-type bit storage to the second-type bit storage.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
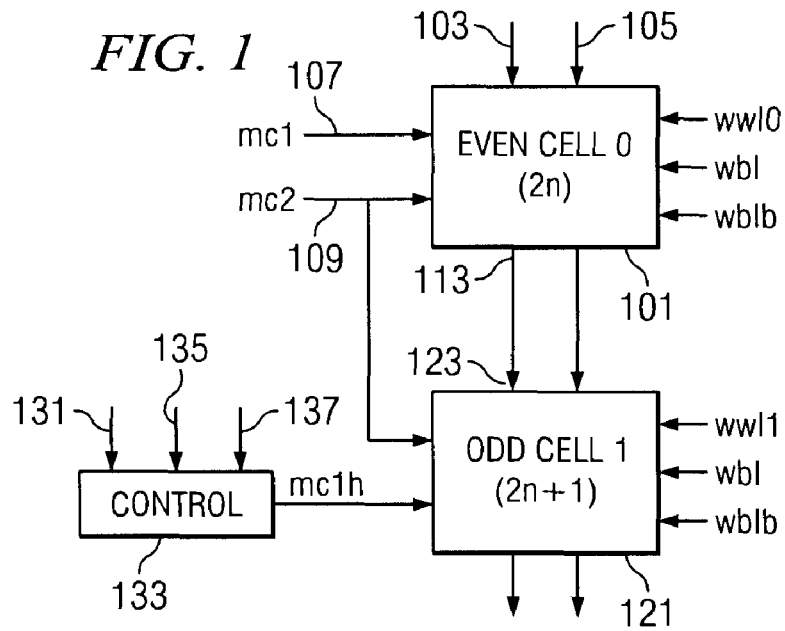
FIG. 1 is a block diagram of a control circuit in accordance with an illustrative embodiment of the present invention.

FIG. 1 is a block diagram of a control circuit in accordance with an illustrative embodiment of the present invention. A first cell or even cell 101 is shown that receives first master clock signal 103 and second master clock signal 105. Even cell 101 may typically be located in a monolithic semiconductor chip comprised of a combination of conductors, semiconductors and insulators. The scan input may connect to a conductor that receives source signals from off the semiconductor chip. Alternatively, the scan input may receive a signal from yet another cell in order to form a chain of scannable latches or registers.

In an illustrative embodiment of the present invention, the first cell in the chain is numbered '0', and thus is a first-type cell. In this illustrative embodiment, the first-type cell is an even cell. Each cell connected to the outputs of a previous cell is numbered according to the formula 'n+1', wherein 'n' represents the number assigned the previous cell or low order cell. The second cell in the chain is numbered '1', and thus is a second-type cell. In this illustrative embodiment, the second-type cell is an odd cell. A second-type bit storage is any storage in any second-type cell. For this illustrative embodiment, a second-type cell includes any cell in a chain of cells numbered according to the formula 2n+1, wherein 'n' represents any non-negative integer. A first-type cell includes any cell in a chain of cells numbered according to the formula 2n, wherein 'n' represents any non-negative integer. A first-type bit storage is any storage in any first-type cell.

It is appreciated that alternate embodiments may be implemented, for example, where a first-type cell in a scan chain is an odd cell, with every second cell in the chain also being an first-type cell. Under such an embodiment, the remaining cells numbered by the formula, 2n+1, are first-type cells, wherein 'n' represents non-negative integers and cell 0 is the first first-type cell. Thus, under the alternate embodiment, first-type cells may be numbered 0, 2, 4, 6, etc., and second-type cells may be numbered 1, 3, 5, 7, etc. . . .

A cell is a collection of circuit components suited for copying and coupling together into a larger logical circuit structure. A circuit designer may couple two cells to form circuits of increasing complexity. Such coupling may be a direct coupling, wherein outputs of a cell may be connected to inputs of another cell. Such coupling may be indirect, wherein outputs of a first cell may be filtered by intervening circuit components before reaching a second cell. Circuit components include components such as, for example, transistors, resistors, capacitors, and inductors.

First-type cell 101 is a scan register, and as such, receives scan clock signals in the form of first master clock 107 and second master clock 109. A scan clock signal is a clock signal, which a circuit designer provides, directly or indirectly, to at least one clock input of a scan register or scan chain. A scan clock signal includes signals that, because of conditioning to improve signal tolerance, or because of signal degradation due to propagation, are slightly modified. A scan clock signal also includes any signals that are complementary to the clock signal. A complementary signal is a signal that provides a logic voltage that is not the logic voltage of a reference signal. For example, if the reference signal is binary 1, then the complementary signal is binary 0.

The second cell in the chain, for example, second-type cell 121, connects second-type cell input 123 to a first-type cell output 113 to form a common line. Without taking into account voltages on an operating circuit, first-type cell 101 and second-type cell 121 have identical logical structures. The differences in each cell may merely be the relative positioning of each cell and the input signals to each cell. For example, first-type cell 101 receives first master clock signal 103 and second master clock signal 105, wherein the first master clock and second master clock signals are complementary to each other. The value of first master clock signal 103 is the opposite of the second master clock signal 105, during stable periods. Unlike first-type cell 101 receiving first master clock signal 103, second-type cell 121 receives control signal 131. Control circuit 133 provides control signal 131 responsive to shift enable signal 135 and clock 137 as well as a first clock signal. A shift enable signal is a signal a circuit designer uses to generate at least one binary 1 signal pulse to a second-type cell based on a concurrent binary 1 signal available from a function clock.

Thus, exemplary embodiments of the present invention permit a user to present signals to the circuit to control the flow of data from a first-type cell to a second-type cell. The circuit is susceptible to loading each cell individually, as well as loading cells by means of scanning input in series through a low order cell to a higher order cell. The circuit may be copied as a series of cells wherein a bit held in each first-type cell is copied to the next higher second-type cell.

Figure 2:
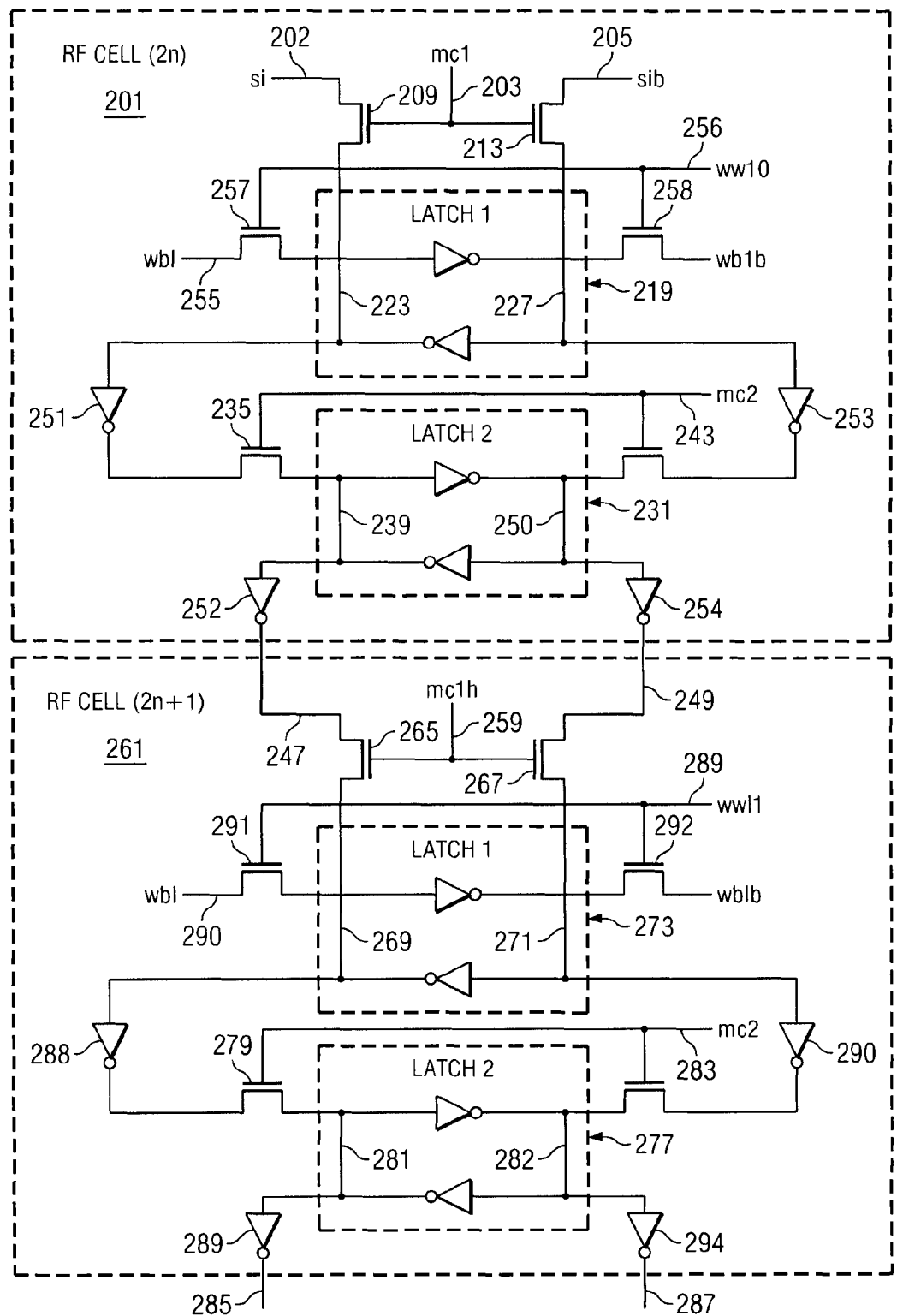
FIG. 2 is a detailed view of some of the circuits of FIG. 1 in accordance with an illustrative embodiment of the present invention.

FIG. 2 is a detailed view of some of the circuits of FIG. 1 in accordance with an illustrative embodiment of the present invention. Circuit designers may implement first-type cell 101 of FIG. 1 as first-type cell 201 in FIG. 2. Circuit designers may implement second-type cell 121 of FIG. 1 as second-type cell 261 of FIG. 2. First-type cell 201 takes inputs through a first-type input line 202. Complementary input line 205 may also be provided. First clock circuit generates master clock signal 203 that controls first first-type gate 209 and complementary first first-type gate 213. The output of these gates appears at primary and complementary nodes of first first-type latch 219. These nodes are comprised of latch 1 primary first-type node 223 and latch 1 complementary first-type node 227.

It is appreciated that many other latches may be applicable, such as, for example, SR latches and D latches. Signals appearing at latch 1 primary first-type node 223 and latch 1 complementary first-type node 227 are presented, perhaps indirectly, to second first-type latch 231. An intervening second first-type gate 235 controls movement of the latch 1 primary first-type node 223 voltage to latch 2 primary first-type node 239. Second first-type gate 235 operates at the control of second clock driver circuit (signal) 243. Second first-type latch 231, in turn, presents signals to first-type output line 247 and complementary first-type output line 249.

Additional circuit features may be present. For example, primary first-type input latch 2 inverter 251 may invert a voltage on second first-type latch 1 primary first-type node 239. To restore any such inverted signal, primary first-type output latch 2 inverter 252 may reverse the inverted voltage. On the complementary side of second first-type latch 231, complementary first-type input latch 2 inverter 253 inverts a voltage on second first-type latch 239 latch 1 complementary first-type node 250. Complementary first-type output latch 2 inverter 254 reverses the inverted voltage.

Furthermore, write voltages carried on first-type write bit line 255 may be presented to latch 1 primary first-type node 223 at the control of signals on write word line first-type 256. A bit line is a conductor that carries data intended for writing to a latch. Write word line first-type 256 controls primary first-type write gate 257 and complementary first-type write gate 258. A write word line is a conductor that carries a control signal to operate a gate that permits a bit line voltage to be written to the latch.

Second-type cell 261 is similar to first-type cell 201 with the exception of the application of first clock circuit master clock signal 203.

Second-type cell 261 takes inputs through an first-type output line 247. Complementary first-type output line 249 may also be provided. A control circuit generates control signal 259 that controls first second-type gate 265 and complementary first second-type gate 267. The control circuit may be, for example, control circuit 133 of FIG. 1. The outputs of these gates appear at primary and complementary nodes of first second-type latch 273. These nodes are comprised of latch 1 primary second-type node 269 and latch 1 complementary second-type node 271.

Signals appearing at latch 1 primary second-type node 269 and latch 1 complementary second-type node 271 are presented, perhaps indirectly, to second second-type latch 277. An intervening second second-type gate 279 controls movement of the latch 1 primary second-type node 269 voltage to latch 2 primary second-type node 281. Second second-type gate 279 operates at the control of second master clock signal 283, much like the analogous gate in first-type cell 201. Second second-type latch 277, in turn, presents signals to second-type output line 285 and complementary second-type output line 287.

Additional circuit features may be present. For example, primary second-type input latch 2 inverter 288 may invert a voltage on second second-type latch 277 to latch primary second-type node 281. To restore any such inverted signal, primary second-type output latch 2 inverter 289 may reverse the inverted voltage. On the complementary side of second second-type latch 277, complementary input second-type latch 2 inverter 290 inverts a voltage on second second-type latch 277 latch complementary second-type node 282. Complementary second-type output latch 2 inverter 291 reverses the inverted voltage.

Furthermore, write voltages carried on second-type write bit line 290 may be presented to latch 1 primary second-type node 271 at the control of signals on write word line second-type 289. Write word line second-type 289 controls primary second-type write gate 292 and complementary second-type write gate 294.

Figure 3:
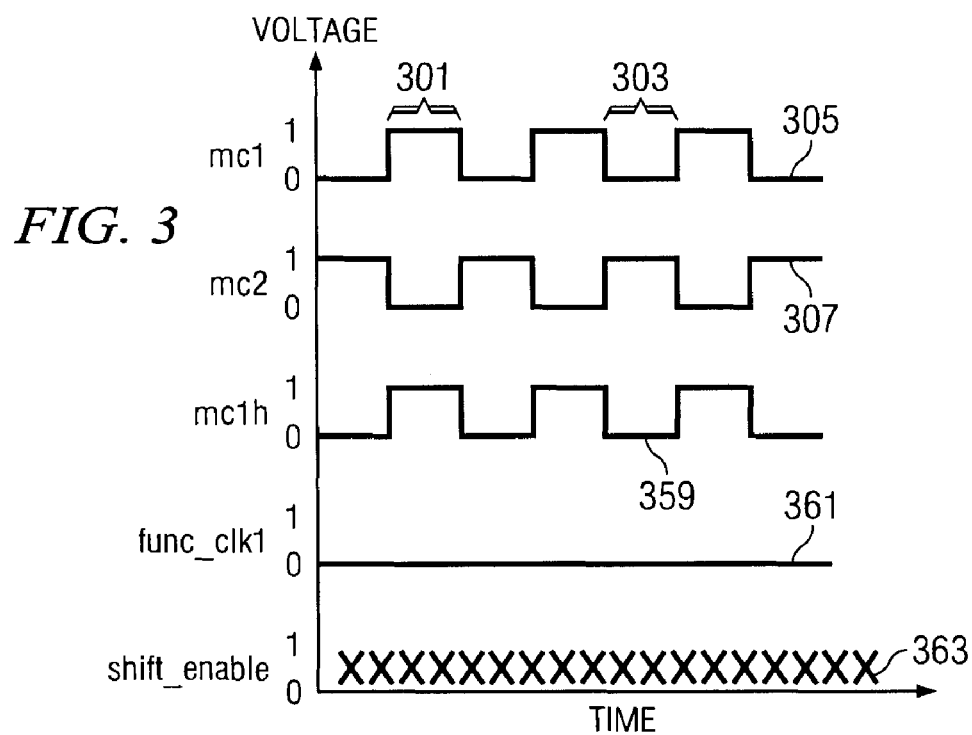
FIG. 3 is a timing diagram of clock signals, and a shift enable signal, among others, in accordance with an illustrative embodiment of the present invention.

FIG. 3 is a timing diagram of clock signals, and a shift enable signal, among others, in accordance with an illustrative embodiment of the present invention. These signals are representative of signals and timing used while the circuits of FIG. 1 and FIG. 2 are operating in scan mode. Scan mode includes two phases: write latch 1 phase 301, and write latch 2 phase 303. For each cell that is presented master clock 1 305, or equivalent, and master clock 2 307, a voltage presented to, for example, gates propagate first-type input line 202 of FIG. 2 to latch 1 primary first-type node 223 during write latch 1 phase 301. For each cell that is presented master clock 1 305, or equivalent, and master clock 2 307, gates propagate further to latch 2 primary first-type node 239 of FIG. 2 during write latch 2 phase 303.

Control signal 359 during scan mode, is set to be the equivalent of master clock 1 305. Function clock 361 is set to binary 0. Shift enable 363 may be set to any voltage that does not impair nearby circuits. In other words, the voltage of shift enable 363 may be binary 0, binary 1 or any voltage in between.

Figure 4:
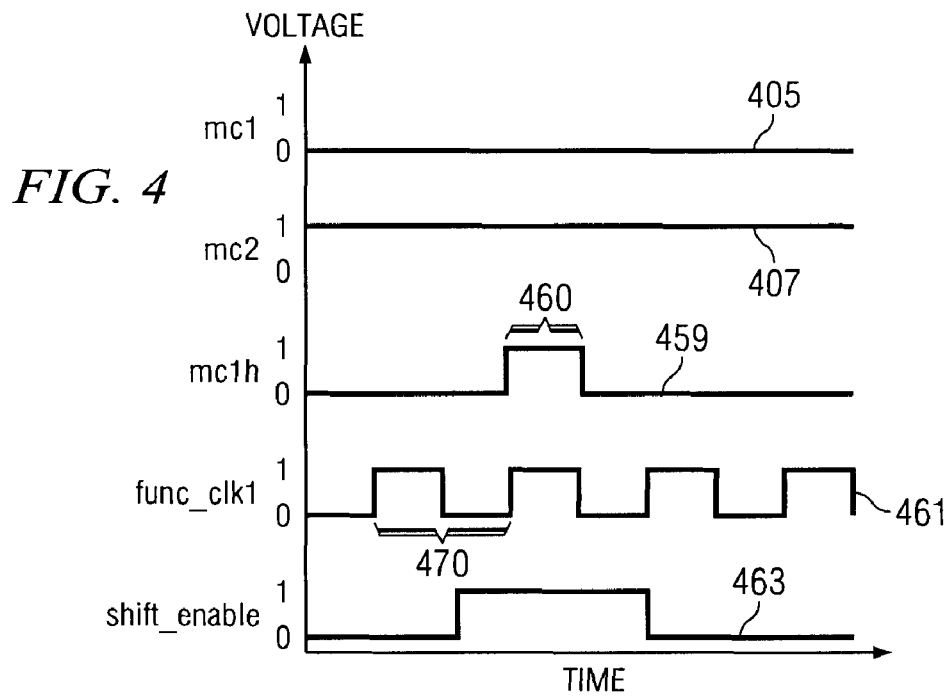
FIG. 4 is a timing diagram of signals during an interval of flushing a bit in accordance with an illustrative embodiment of the present invention.

FIG. 4 is a timing diagram of signals during an interval of flushing a bit in accordance with an illustrative embodiment of the present invention. Master clock 1 405 is held to binary 0. Master clock 2 407 is held to binary 1. Holding means that the signal is kept within the tolerances of typically accepted voltages for either binary 1 or 0. Control signal 459 operates responsive to function clock 461 and shift enable 463. Not shown is the scan clock, which is held to binary 0 during flush mode. Shift enable 463 is held to binary 1 during at least one binary 1 phase of function clock 461. The control circuit presents pulse 460, or binary 1 during such times that both function clock 461 and shift enable 463 are binary 1. During pulse 460, control signal 459 opens the first second-type gate to allow an second-type cell to receive a first-type cell output. At that time, the first second-type latch receives the logic voltage.

Figure 5:
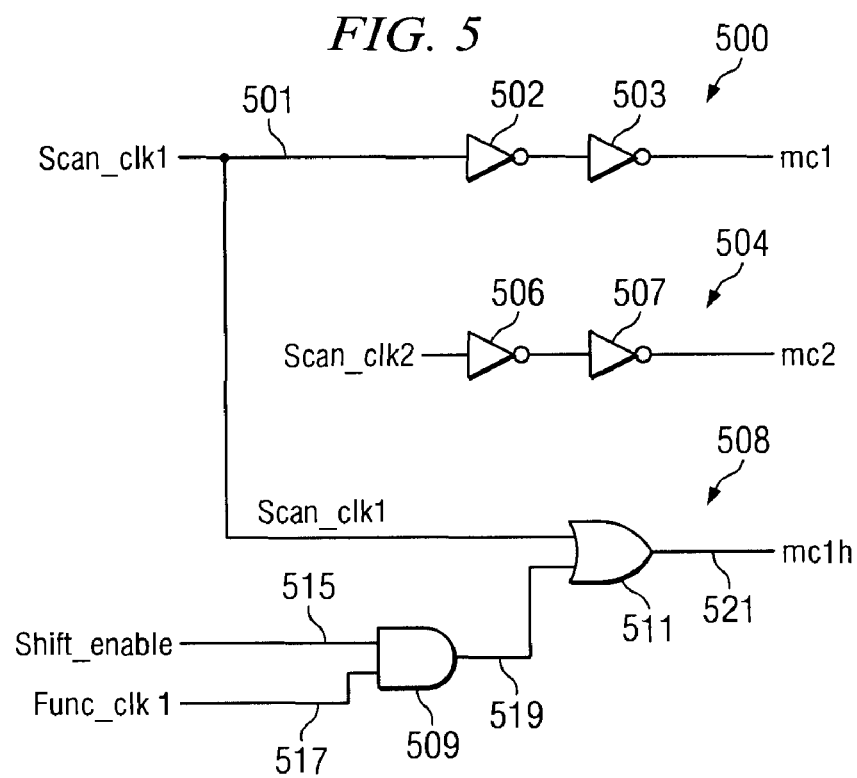
FIG. 5 is a detailed view of a control circuit in accordance with an illustrative embodiment of the present invention.

FIG. 5 is a detailed view of a control circuit in accordance with an illustrative embodiment of the present invention, for example, first clock circuit 500. A scan clock provides first scan clock signal to first inverter 502. First scan clock signal 501 is an oscillating waveform. First inverter 502 drives second inverter 503. These two inverters adjust the oscillating waveform to have sharper transitions in voltage. First clock circuit 500 provides, for example, first master clock signal 107 of FIG. 1.

FIG. 5 also shows second clock circuit 504. A second scan clock, 180 degrees out of phase with the first scan clock, provides an oscillating waveform to complementary first inverter 505. Complementary first inverter 505 further provides the now inverted signal to complementary second inverter 507. Additional circuits on the input or the output of second clock circuit 504 may alter the output signal to set the output signal to a constant binary 0 or a constant binary 1 over an interval. Such additional circuits permit an operator to generate the master clock 1 and master clock 2 signals of FIG. 3 or FIG. 4. Second clock circuit 504 provides, for example, second master clock signal 109 of FIG. 1.

Control circuit 508 generates control signal 521 and transmits control signal 521 to a second-type cell, for example, second-type cell 121 of FIG. 1. An operator provides AND gate 509 for anding flush input signal 515 with functional clock 517. AND gate 509 provides output 519 to OR gate 511. OR gate 511 receives first scan clock signal 501 and forms control signal 521. Control signal 521 may drive a second-type cell circuit in the manner described above. For example, the control signal flushes a logic voltage from the first-type bit storage to the second-type bit storage.

Control signal may be responsive to a master clock 1 or a master clock 2 being persistently at a constant logic voltage in relation to a system clock. A logic circuit may produce a control signal when either clock remains at a constant logic voltage for a persistent interval. A persistent interval is at least one complete clock cycle of the system clock. For example, interval 470 may be a persistent interval. The system clock may be function clock signal 461. Interval 470 may be a full cycle of function clock signal 461.

FIG. 1 shows first-type cell 101 and second-type cell 121 may be arranged in a chain of similar copies to first-type cell 101 and second-type cell 121, wherein cells are enumerated 0, 1, 2, 3, and so on in a series. Each first-type cell has a first-type input line connected to the second-type output line of the immediate predecessor second-type cell. That is, cell number 2, a first-type cell, connects to the output of cell number 1. Similarly, cell number 4 connects to the output of cell number 3. Such a chain may continue to a length selected by the circuit designer. When an operator selects the control signal and other clock signals to be in flush mode, the operator flushes the logic voltage of each first-type cell. Consequently, each second-type cell that is coupled to a first-type cell receives the logic voltage held in the first-type cell.

Thus, a circuit is shown which permits a user to present signals to the circuit to control the flow of data from a first-type cell to a second-type cell. The circuit is susceptible to loading each cell individually, as well as loading cells by means of scanning input in a series through a low order cell to a higher order cell. The circuit may be copied as a series of cells wherein a bit held in each first-type cell is copied to the next higher second-type cell.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. In a scan chain of registers including a plurality of first cells numbered according to a formula 2n and a plurality of second cells numbered according to a formula 2n+1, wherein n represents a non-negative integer, an output of a first 2n cell of the plurality of first cells being communicatively connected to an input of a second 2n+1 cell of the plurality of second cells, a method of controlling data flow comprising:

selecting a mode of operation for control signals and clock signals that enable the transfer of bits stored in the plurality of first cells to the plurality of second cells, the mode of operation being one of a scan mode and a flush mode;

responsive to the selection of a flush mode, enabling a shift enable signal and a function clock signal in a control circuit;

generating an output from the control circuit, based on the enabled control circuit signals, that enables the second 2n+1 cell to receive an output bit stored in the first 2n cell, while the input to another first 2n cell directly connected to and numerically greater than the second 2n+1 cell is disabled, wherein the generating comprises:

logically anding the shift enable signal with the function clock signal to form a first output within the control circuit;

logically oring the first output within the control circuit with a first scan clock signal input to the control circuit to form the output from the control circuit, the first scan clock signal being disabled in the flush mode; and operating the control circuit output responsive to logic voltages on the shift enable signal, the function clock signal, and the first scan clock signal, wherein the control circuit outputs a binary one when the function clock signal and the shift enable signal are both a binary one; and flushing, based on the enabling, the bits stored in the plurality of first 2n cells to the plurality of second 2n+1 cells.

2. The method of claim 1, further comprising:

holding an input from a first master clock to a binary value of zero; and holding an input from a second master clock to a binary value of one, wherein the first and second master clock are input to the plurality of second cells.

3. The method of claim 1 comprising:

responsive to the selection of a scan mode, disabling the shift enable signal and the function clock signal input to the control circuit;

synchronizing a scan clock signal input to the control circuit to a master clock signal;

generating an output from the control circuit based on the scan clock signal that activates a cell gate in a second 2n+1 cell to receive an output bit from a gate in a first 2n cell: and shifting, based on the enabling, bits stored in the plurality of first cells to the plurality of second cells and bits stored in the plurality of second cells to the plurality of first cells.

* * * * *